US010950488B2

(12) United States Patent
Kim et al.

(10) Patent No.: US 10,950,488 B2
(45) Date of Patent: Mar. 16, 2021

(54) INTEGRATION OF FINFET DEVICE

(71) Applicant: Texas Instruments Incorporated, Dallas, TX (US)

(72) Inventors: Ryoung-han Kim, Plano, TX (US); Kwanyong Lim, Plano, TX (US); Youn Sung Choi, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/414,525

(22) Filed: May 16, 2019

(65) Prior Publication Data
US 2019/0273013 A1 Sep. 5, 2019

Related U.S. Application Data

(62) Division of application No. 15/843,629, filed on Dec. 15, 2017, now abandoned, which is a division of application No. 14/499,957, filed on Sep. 29, 2014, now abandoned.

(60) Provisional application No. 61/915,038, filed on Dec. 12, 2013.

(51) Int. Cl.
| H01L 21/762 | (2006.01) |
| H01L 29/66 | (2006.01) |
| H01L 21/8234 | (2006.01) |
| H01L 27/11 | (2006.01) |
| H01L 21/84 | (2006.01) |
| H01L 27/088 | (2006.01) |
| H01L 21/308 | (2006.01) |

(52) U.S. Cl.
CPC .......... *H01L 21/76224* (2013.01); *H01L 21/823431* (2013.01); *H01L 21/845* (2013.01); *H01L 27/0886* (2013.01); *H01L 27/1108* (2013.01); *H01L 29/66795* (2013.01); *H01L 21/3081* (2013.01)

(58) Field of Classification Search
CPC ......... H01L 29/66795; H01L 29/66545; H01L 21/823431; H01L 29/785; H01L 27/0886
See application file for complete search history.

(56) References Cited

U.S. PATENT DOCUMENTS

| 2007/0170474 A1 | 7/2007 | Kawasaki |
| 2008/0157225 A1 | 7/2008 | Datta et al. |
| 2013/0049136 A1 | 2/2013 | Wahl et al. |

(Continued)

FOREIGN PATENT DOCUMENTS

CN 102074582 A 5/2011

*Primary Examiner* — Tony Tran
(74) *Attorney, Agent, or Firm* — Jacqueline J. Garner; Charles A. Brill; Frank D. Cimino

(57) ABSTRACT

An integrated circuit containing finFETs may be formed with fins extending above isolation oxide. A first finFET and a second finFET have exposed fin heights which are different by at least 25 percent. The exposed fin height is a vertical height of a sidewall of the fin above the isolation oxide. Gates are formed over the fins. In one version, a fin height of the first finFET is less than a fin height of the second finFET; a thickness of the isolation oxide adjacent to fins of the first finFET and the second finFET is substantially uniform. The fin height is the height of a top of the fin above the substrate. In another version, the isolation oxide is thinner at the first finFET than at the second finFET; the fin heights of the first finFET and the second finFET are substantially equal.

15 Claims, 18 Drawing Sheets

(56) References Cited

U.S. PATENT DOCUMENTS

2014/0138600 A1    5/2014  Satoh et al.
2014/0339643 A1*  11/2014  Cheng ............... H01L 21/76224
                                                               257/369
2015/0035069 A1    2/2015  Hung et al.
2015/0069526 A1    3/2015  Basker et al.

* cited by examiner

INTEGRATION OF FINFET DEVICE

CROSS-REFERENCE TO RELATED APPLICATIONS

This application is a divisional of U.S. Nonprovisional patent application Ser. No. 15/843,629, filed Dec. 15, 2017, which is a divisional of U.S. Nonprovisional patent application Ser. No. 14/499,957, filed Sep. 29, 2014, which claims the benefit of U.S. Provisional Application Ser. No. 61/915,038, filed Dec. 12, 2013, the contents of all of which are herein incorporated by reference in its entirety.

FIELD OF THE INVENTION

This invention relates to the field of integrated circuits. More particularly, this invention relates to fin field effect transistors (finFETs) in integrated circuits.

BACKGROUND OF THE INVENTION

An integrated circuit may include finFETs in logic or memory circuits. FinFETs may desirably provide increased on-state currents compared to planar FETs having similar footprints. FinFETs may be formed with the fins having constant pitch and width, and the gates having constant width and pitch, so as to provide a desired circuit density. It may be desirable to have some instances of the finFETs with higher on-state currents than adjacent finFETs, for example in delay circuits or in drivers of static random access memory (SRAM) cells. Forming finFETs with varying on-state currents in constant width and pitch configurations may involve adding additional fins to the finFETs, undesirably increasing footprints of the finFETs. It may further be problematic to increase the on-state current by a fractional amount, such as 50 percent, by adding a fin, since fins are added in integral numbers.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing finFETs may be formed so that fins of the finFETs extend above an isolation oxide formed over a substrate of the integrated circuit. A first finFET and a second finFET have exposed fin heights which are different by at least 25 percent. The exposed fin height is a vertical height of a sidewall of the fin above the isolation oxide. Gates are formed over the fins, extending down the sidewalls of the fins, so that finFETs with greater exposed fin heights have greater effective channel widths and hence greater on-state currents compared with similar finFETs with lesser exposed fin heights.

In one version, a fin height of the first finFET is less than a fin height of the second finFET; a thickness of the isolation oxide adjacent to fins of the first finFET and the second finFET is substantially uniform. The fin height is the height of a top of the fin above the substrate adjacent to the fin, and so includes a portion of the fin adjacent to the isolation oxide. In another version, the isolation oxide is thinner at the first finFET than at the second finFET; the fin heights of the first finFET and the second finFET are substantially equal.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The following application contains related material and is hereby incorporated in its entirety: application Ser. No. 14/500,002 entitled "METHOD OF PRINTING MULTIPLE STRUCTURE WIDTHS USING SPACER DOUBLE PATTERNING" filed concurrently with this application.

An integrated circuit containing finFETs may be formed so that fins of the finFETs extend above an isolation oxide formed over a substrate of the integrated circuit. A first finFET has a first exposed fin height and a second finFET has a second exposed fin height; the first exposed fin height and the second exposed fin height are different by at least 25 percent. The exposed fin height is a vertical height of a sidewall of the fin above the isolation oxide. Gates are formed over the fins, extending down the sidewalls of the fins, so that finFETs with greater exposed fin heights have greater effective channel widths and hence greater on-state currents compared with similar finFETs with lesser exposed fin heights.

Fin widths of the first finFET and the second finFET may be substantially equal. Gate widths of the first finFET and the second finFET may be substantially equal. The first finFET and the second finFET may be part of a plurality of finFETs with substantially uniform fin width and pitch, and/or substantially uniform gate width and pitch. The first finFET and the second finFET may be part of an SRAM cell.

In one version, a fin height of the first finFET is less than a fin height of the second finFET; a thickness of the isolation oxide adjacent to fins of the first finFET and the second finFET is substantially uniform. The fin height is the height of a top of the fin above the substrate adjacent to the fin, including a portion of the fin adjacent to the isolation oxide. In another version, the isolation oxide is thinner at the first finFET than at the second finFET; the fin heights of the first finFET and the second finFET are substantially equal.

Figure 1:
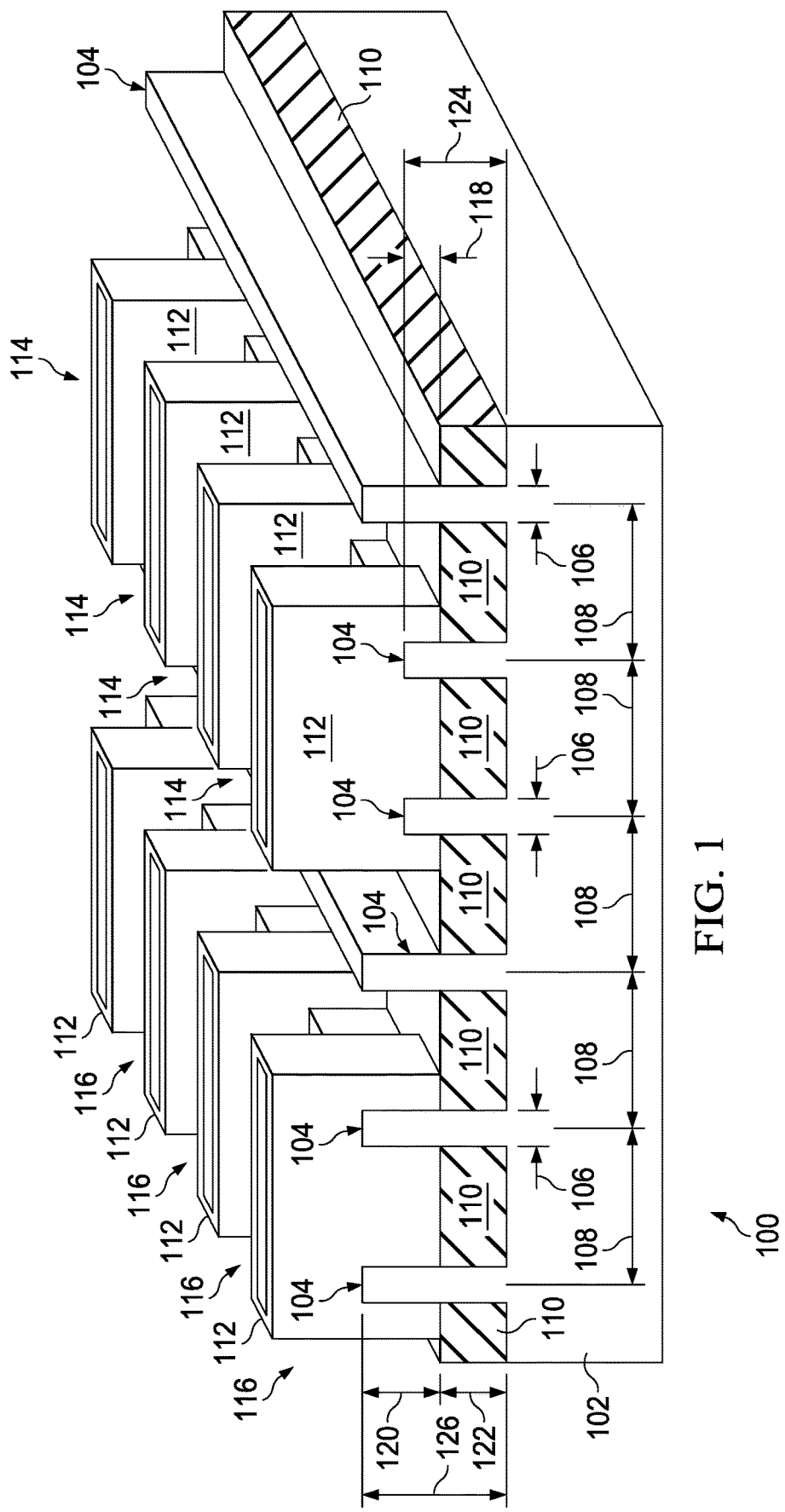
FIG. 1 is a cross section of an example integrated circuit containing finFETs.

FIG. 1 is a cross section of an example integrated circuit containing finFETs. The integrated circuit 100 is formed on a substrate 102 which includes semiconductor material such as silicon. Fins 104 are formed on the substrate 102, for example by forming an etch mask covering areas for the fins 104 and removing semiconductor material from the substrate 102 between the fins 104. Widths 106 of the fins 104 may be substantially equal. Pitch distances 108 between centers of adjacent fins 104 may be substantially equal.

Isolation oxide 110 is disposed over the substrate 102 adjacent to the fins 104. The isolation oxide 110 may possibly include silicon nitride or other dielectric material. Gates 112 are disposed across the fins 104 and extend substantially down to the isolation oxide 110. The gates 112 may be metal replacement gates as depicted in FIG. 1 or may be polysilicon gates.

The integrated circuit 100 includes at least one instance of a first finFET 114 and at least one instance of a second finFET 116. Instances of the first finFET 114 have an exposed fin height 118 which is at least 25 percent less than an exposed fin height 120 of instances of the second finFET 116. A thickness 122 of the isolation oxide 110 is substantially equal in instances of the first finFET 114 and instances of the second finFET 116. Fin heights 124 of the first finFETs 114 are less than fin heights 126 of the second finFETs 116. It will be recognized that instances of the first finFETs 114 may include exactly one instance of the gates 112 over exactly one instance of the fins 104, may include exactly one instance of the gates 112 over a plurality of instances of the fins 104, may include a plurality of instances of the gates 112 over exactly one instance of the fins 104, and/or may include a plurality of instances of the gates 112 over a plurality of instances of the fins 104. Similarly, instances of the second finFETs 116 may include one or more instances of the gates 112 over one or more instances of the fins 104.

On-state current in the finFETs 114 and 116 is an increasing function of the exposed fin heights 118 and 120 and fin widths, and a decreasing function of widths of the gates 112. Instances of the first finFET 114 have a lower on-state current than comparable instances of the second finFET 116 with equal numbers of gates 112 over equal numbers of fins 104. The exposed fin height 118 of the first finFETs 114 may be selected to provide a desired on-state current. Forming the integrated circuit 100 with instances of the first finFET 114 and the second finFET 116 may advantageously provide desired circuit densities compared to an integrated circuit with substantially equal exposed fin heights in all finFETs.

Figure 2A:
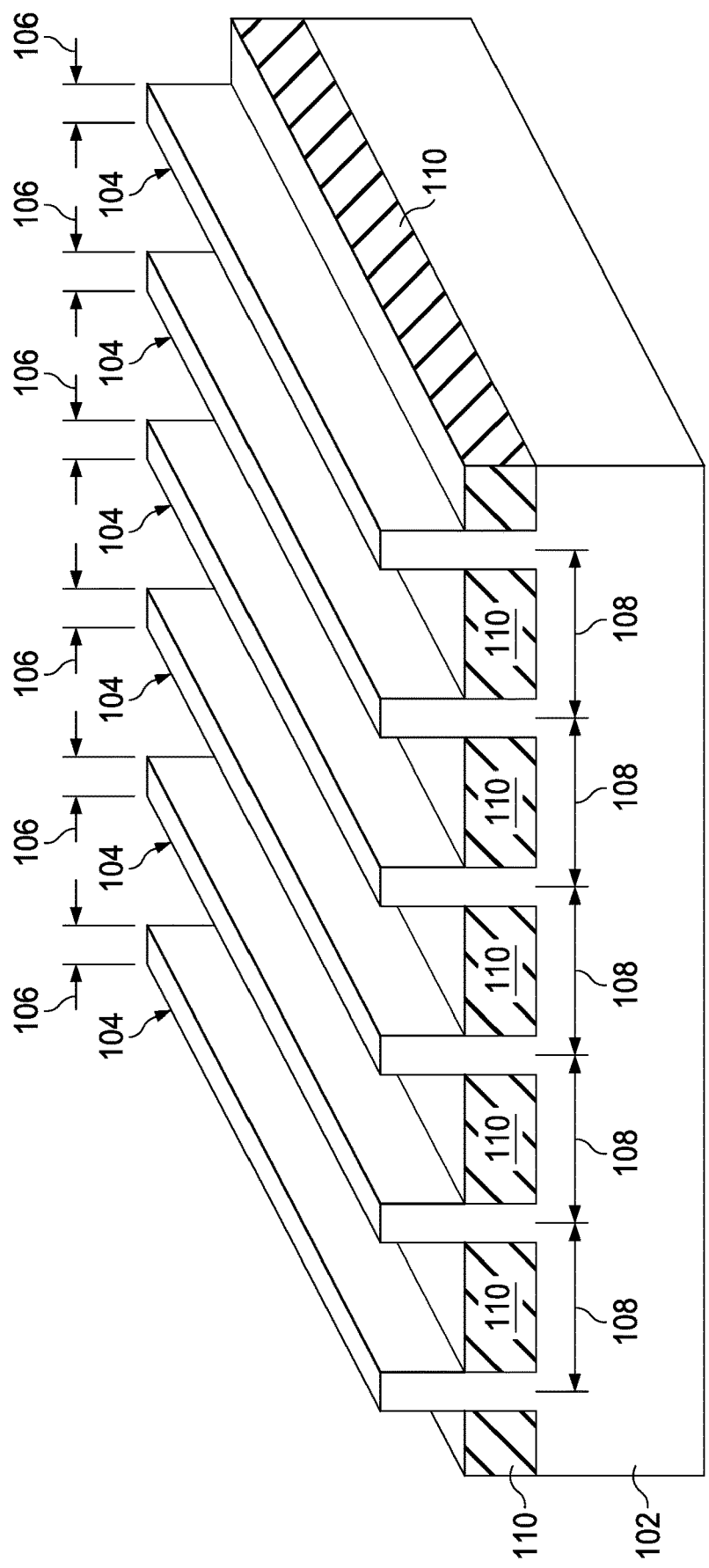
FIG. 2A through FIG. 2H are cross sections of the integrated circuit of FIG. 1, depicted in successive stages of fabrication.

FIG. 2A through FIG. 2H are cross sections of the integrated circuit of FIG. 1, depicted in successive stages of fabrication. Referring to FIG. 2A, the integrated circuit 100 is formed on the substrate 102, which may be, for example, a single crystal silicon wafer or a silicon-on-insulator (SOI) wafer. The substrate 102 includes semiconductor material such as crystalline silicon or a silicon-containing compound semiconductor.

The fins 104 are formed on the semiconductor material of the substrate 102. The fins 104 may be formed, for example, by forming an etch mask over the substrate 102 which covers areas for the fins 104 and subsequently removing the semiconductor material exposed by the etch mask, leaving the fins 104. The etch mask is removed after the fins 104 are formed. Alternatively, the fins 104 may be formed by an epitaxial growth process on the substrate 102. Heights of the fins 104 at this stage of fabrication are substantially equal. Widths 106 of the fins 104 may be substantially equal. Pitch distances 108 between centers of adjacent fins 104 may be substantially equal. Forming the fins 104 with substantially equal widths 106 and/or substantially equal pitch distances 108 may advantageously reduce a size and a fabrication cost of the integrated circuit 100.

The isolation oxide 110 is formed over the substrate 102 between the fins 104. The isolation oxide 110 may be formed as part of a field oxide formation process, such as a shallow trench isolation (STI) process. Exposed fin heights of the fins 104 at this stage of fabrication are substantially equal.

Figure 2B:
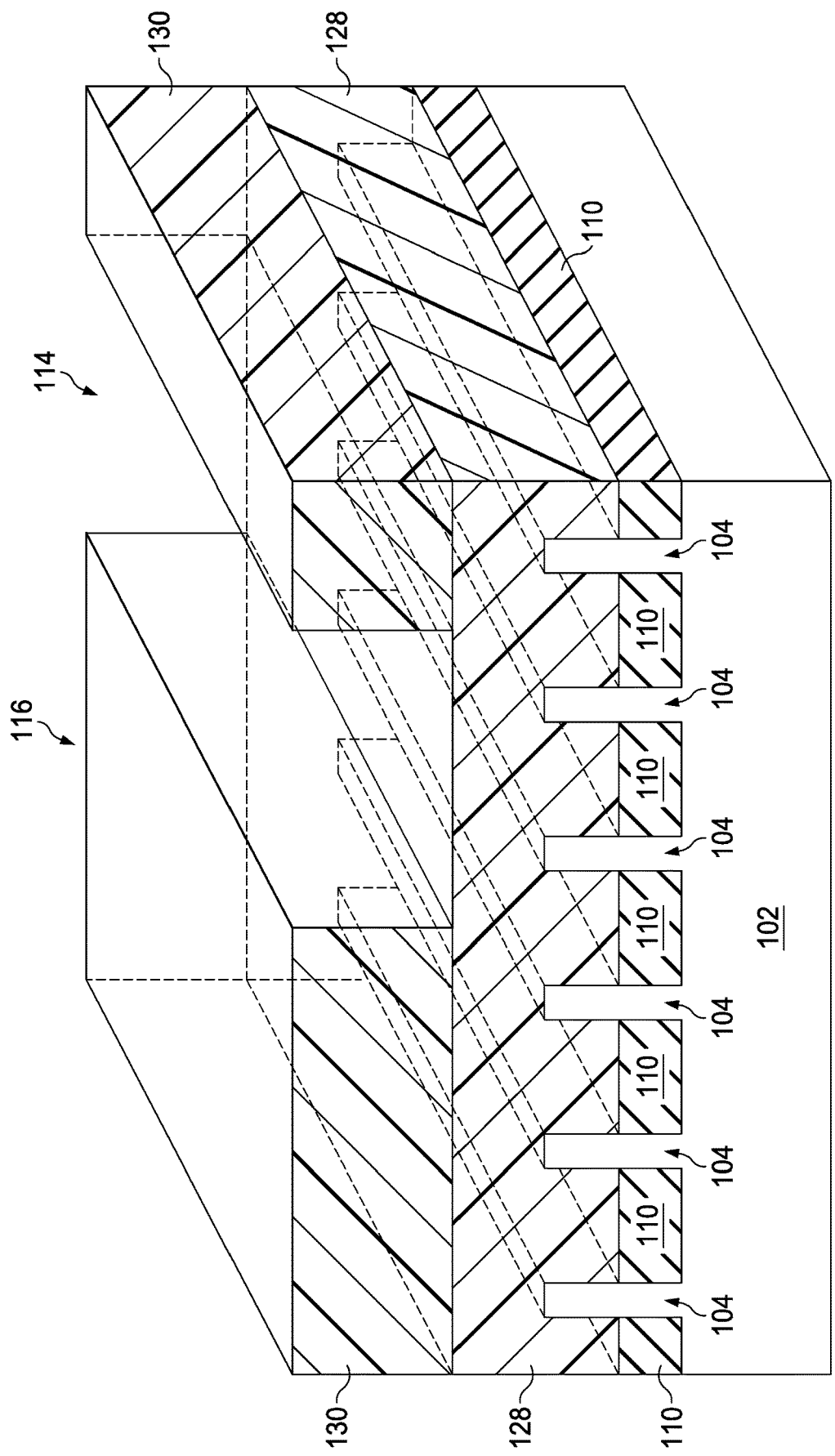

Referring to FIG. 2B, a layer of anti-reflection coating 128 is formed over the fins 104 and the isolation oxide 110. The anti-reflection coating 128 may include a lower layer of spin-on organic resin, a middle layer of organic polymer material such as an organosilicate copolymer in a 1-methoxy-2-acetoxypropane (PGMEA) solvent, and a top layer of inorganic material such as amorphous carbon.

An etch mask 130 is formed over the layer of anti-reflection coating 128 so as to expose areas for instances of the first finFET 114 and cover areas for instances of the second finFET 116. The etch mask 130 may include photoresist formed by a photolithographic process.

Figure 2C:
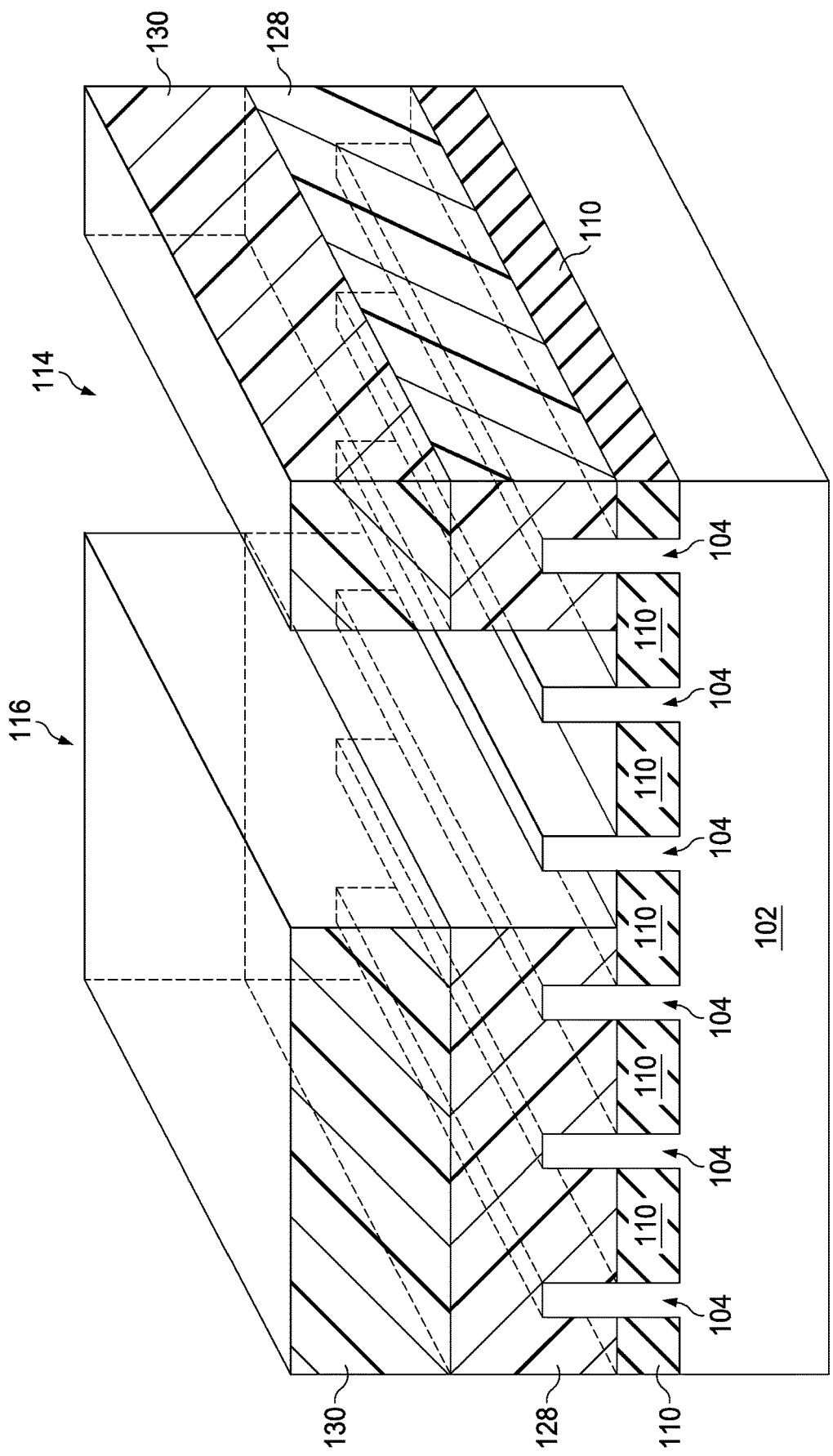

Referring to FIG. 2C, the layer of anti-reflection coating 128 is removed in areas exposed by the etch mask 130 so as to expose the fins 104 in areas for instances of the first finFET 114 and cover the fins 104 in areas for the second finFET 116. The layer of anti-reflection coating 128 may be removed by a reactive ion etch (ME) process using oxygen and fluorine radicals. The etch mask 130 is subsequently removed.

Figure 2D:
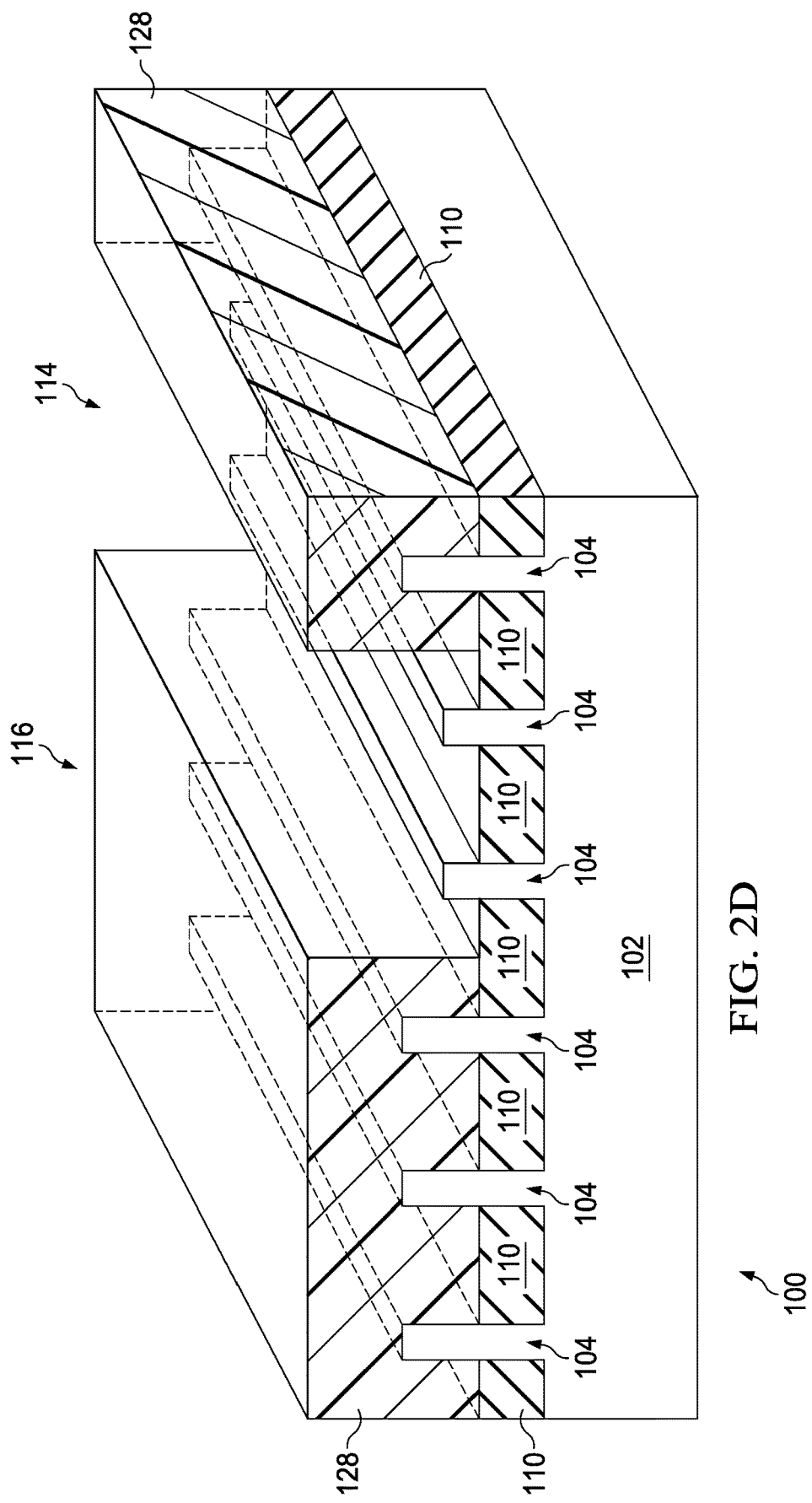

Referring to FIG. 2D, semiconductor material is removed from tops of the fins 104 exposed by the layer of anti-reflection coating 128. The semiconductor material may be removed by an RIE process using fluorine and/or bromine radicals. The semiconductor material may be removed in a timed-etch mode, so that a desired exposed fin height is obtained for the fins 104 exposed by the layer of anti-reflection coating 128. The semiconductor material is removed using an etch process that is selective to the isolation oxide 110, so that a thickness of the isolation oxide 110 removed is significantly less than the thickness of semiconductor removed from the fins 104.

Figure 2E:
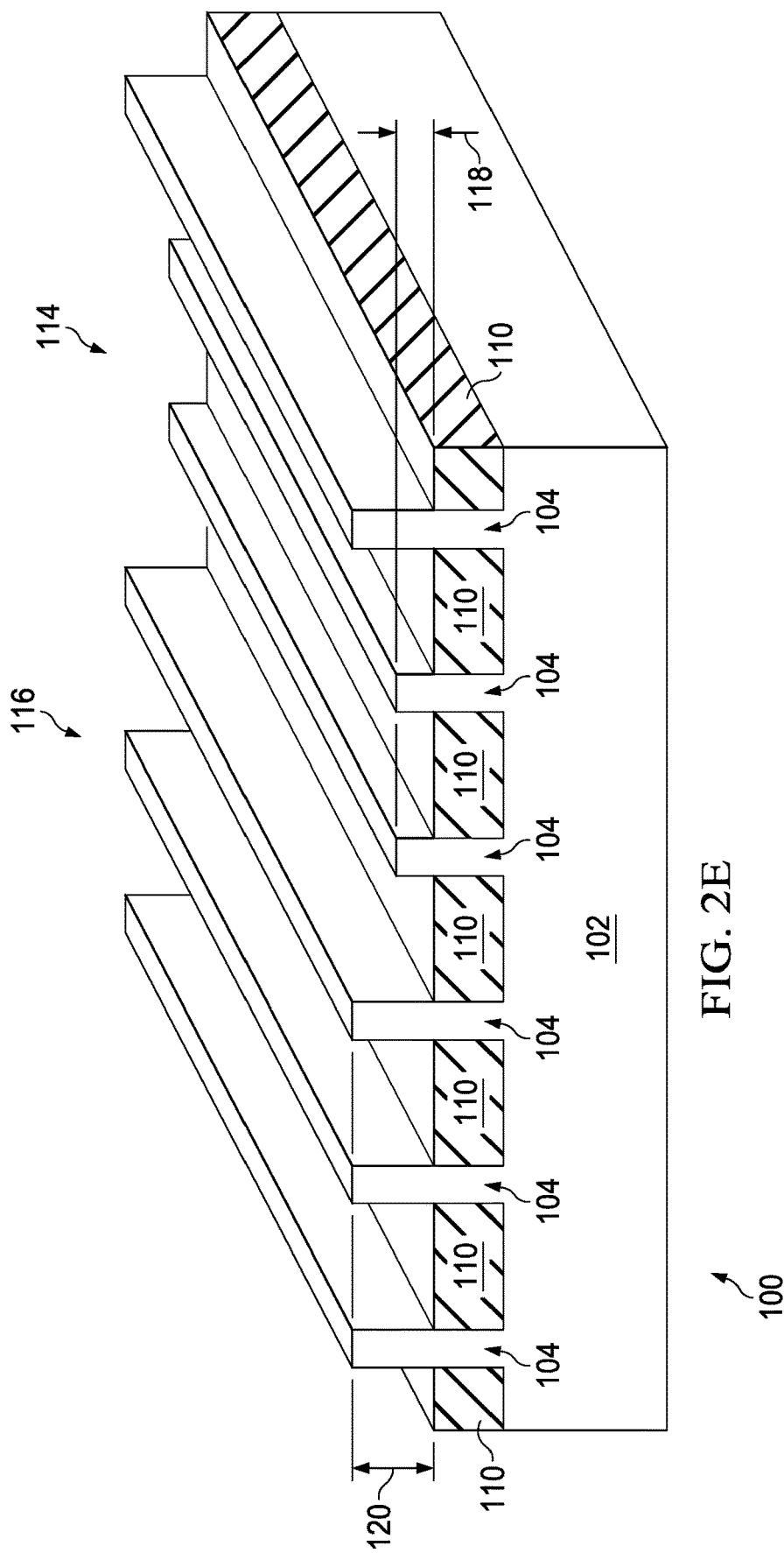

Referring to FIG. 2E, the layer of anti-reflection coating 128 of FIG. 2D is removed, for example by an ashing process. After the layer of anti-reflection coating 128 is removed, the exposed fin height 118 in the first finFET 114 and the exposed fin height 120 in the second finFET 116 are at desired values. Gate dielectric layers are formed on the fins 104, possibly by thermally oxidizing a layer of the semiconductor material in the fins 104.

Alternatively, the layer of anti-reflection coating 128 of FIG. 2B through FIG. 2D may be dispensed with, and the etch mask 130 of FIG. 2B formed directly over the fins 104.

Figure 2F:
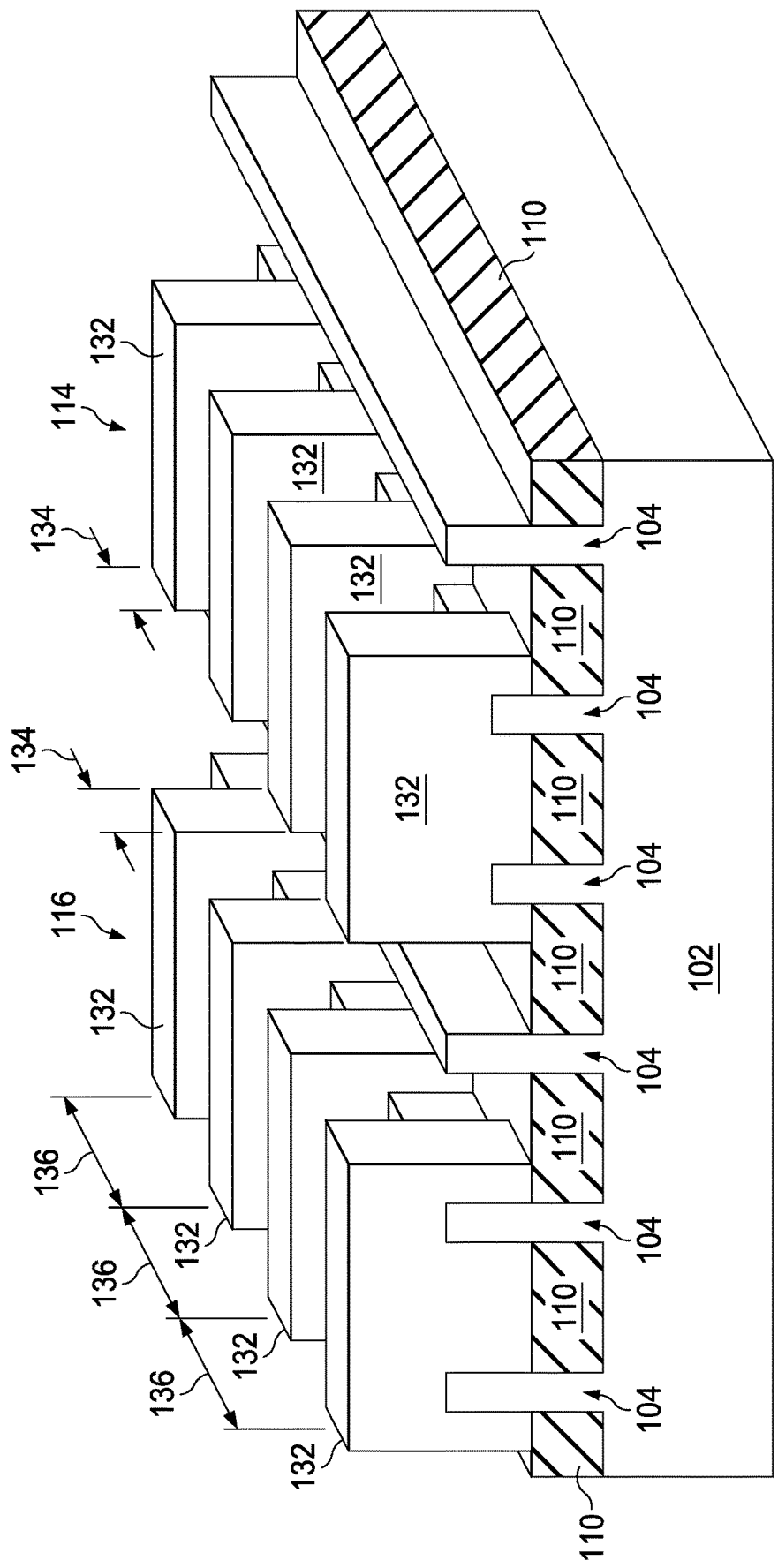

Referring to FIG. 2F, polysilicon gates 132 are formed over the fins 104 so as to extend substantially down to the isolation oxide 110. The polysilicon gates 132 may be formed to have uniform widths 134 and/or uniform pitch distances 136. Forming the polysilicon gates 132 with substantially equal widths 134 and/or substantially equal pitch distances 136 may advantageously reduce a size and a fabrication cost of the integrated circuit 100. The integrated circuit 100 may be completed with the polysilicon gates 132 in place, or the fabrication sequence may optionally continue with a metal replacement gate process described in reference to FIG. 2G and FIG. 2H. Completing the integrated circuit 100 with the polysilicon gates 132 in place may advantageously provide a desired low fabrication cost.

Figure 2G:
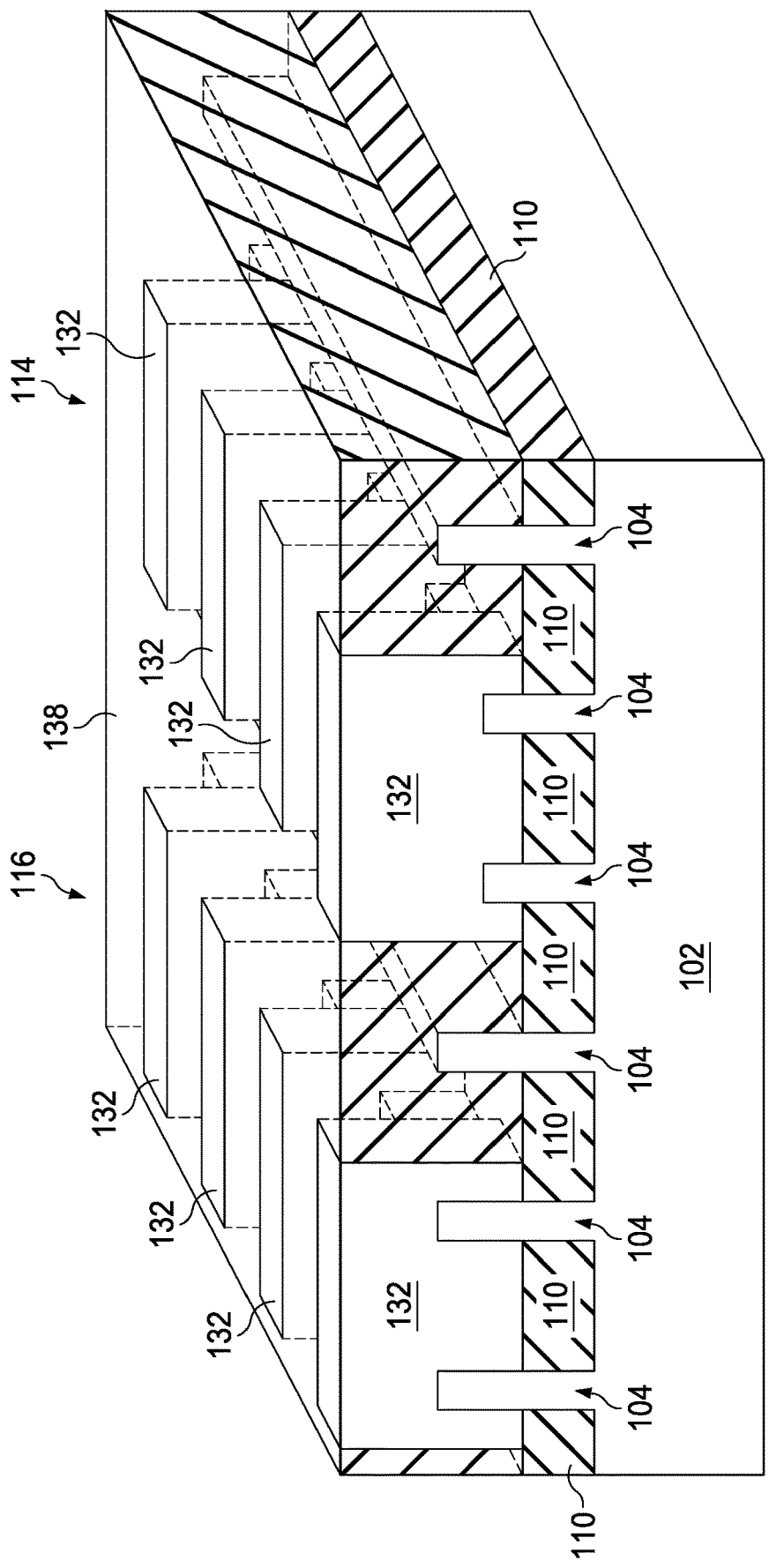

Referring to FIG. 2G, a dielectric layer 138 is formed over the polysilicon gates 132 and planarized so as to expose top surfaces of the polysilicon gates 132. The dielectric layer 138 may include, for example, silicon dioxide formed from methylsilsesquioxane (MSQ), or may include silicon dioxide formed by a plasma enhanced chemical vapor deposition (PECVD) process using ozone, known as a high aspect ratio process (HARP). The dielectric layer 138 may be planarized using a chemical mechanical polish (CMP) process or a resist etchback (REB) process.

Figure 2H:
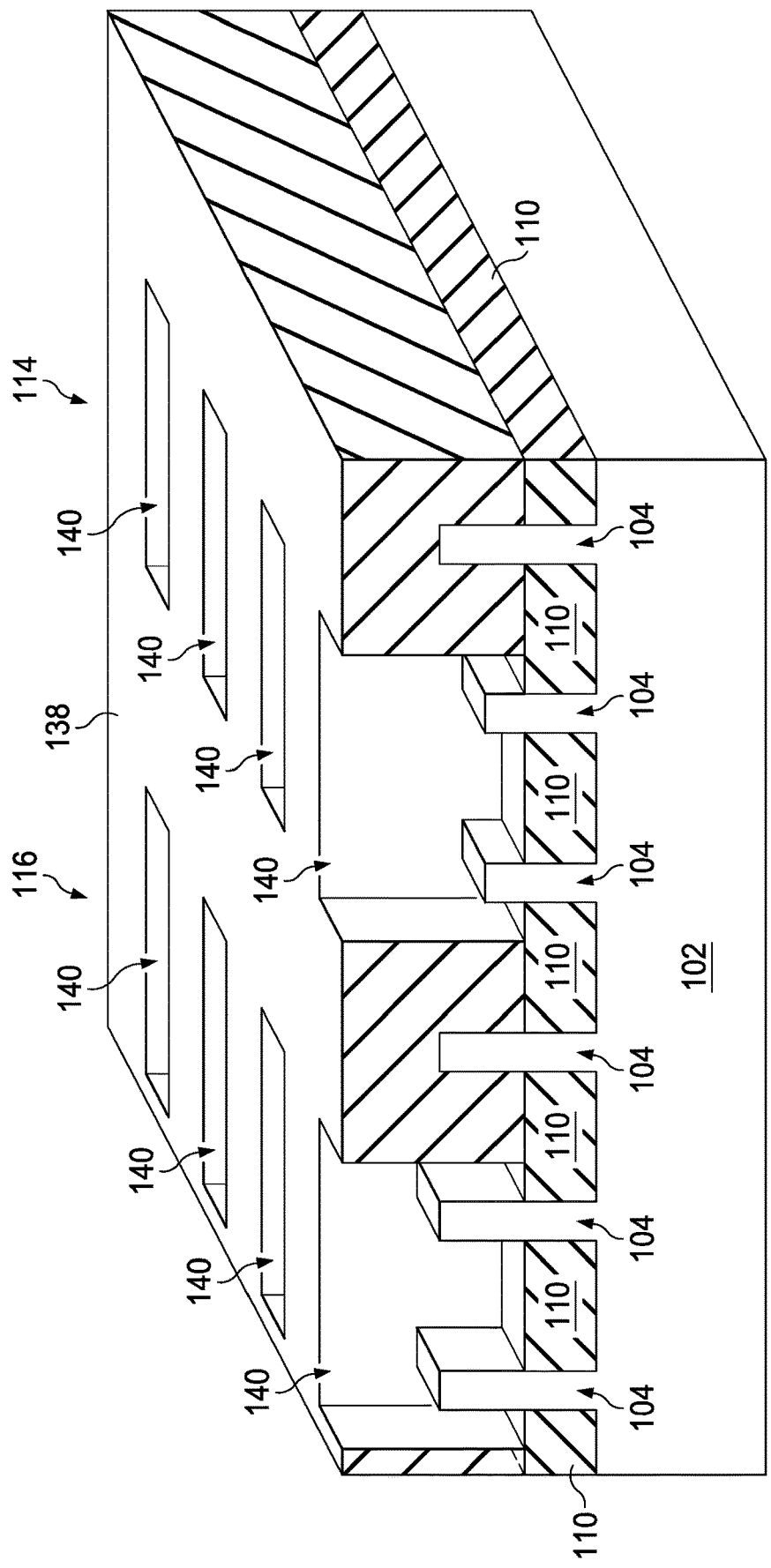

Referring to FIG. 2H, the polysilicon gates 132 of FIG. 2G are removed, leaving gate cavities 140 in the dielectric layer 138. The polysilicon gates 132 may be removed, for example, using an aqueous solution of ammonium hydroxide or tetra-methyl ammonium hydroxide. The gate dielectric layers may also be removed. Replacement metal gates are formed in the gate cavities 140 to form the structure of FIG. 1. Forming metal replacement gates may advantageously provide a desired level of on-state current in the finFETs 114 and 116.

Figure 3A:
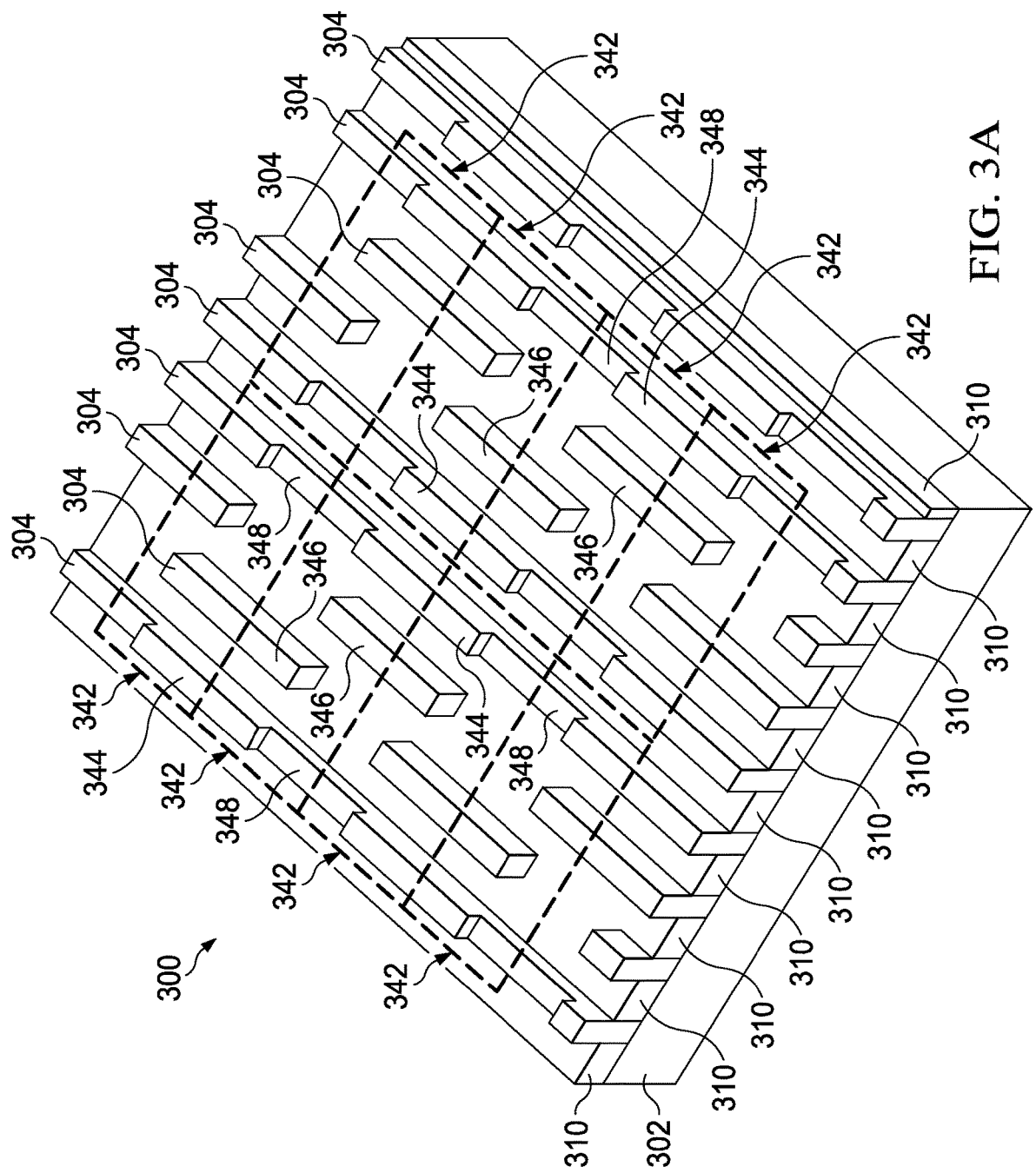
FIG. 3A and FIG. 3B are perspectives of an example integrated circuit containing an SRAM with finFETs formed according the process of FIG. 1 and FIG. 2A through FIG. 2H.
Figure 3B:
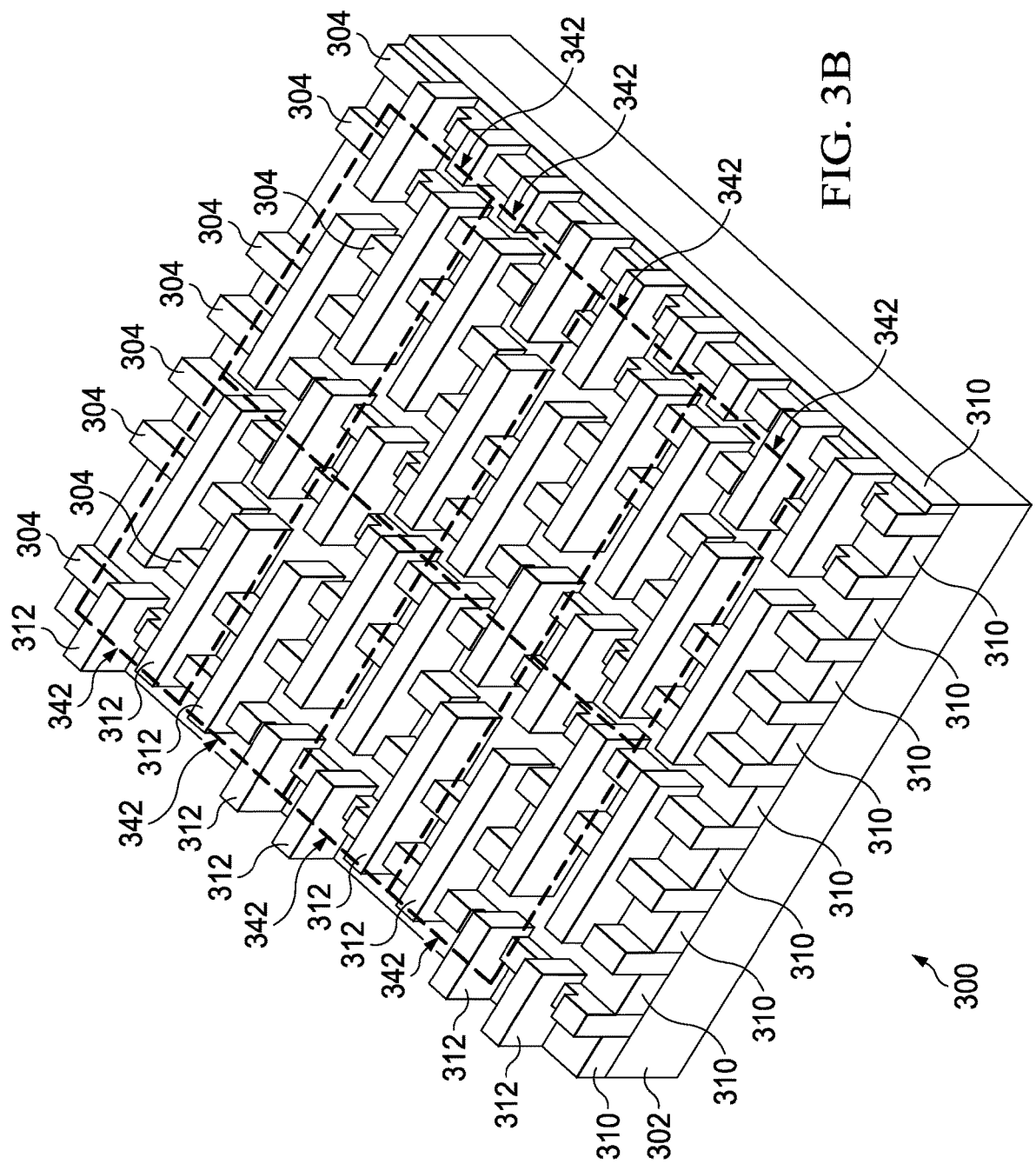

FIG. 3A and FIG. 3B are perspectives of an example integrated circuit containing an SRAM with finFETs formed according the process of FIG. 1 and FIG. 2A through FIG. 2H. Referring to FIG. 3A, the integrated circuit 300 is formed on a substrate 302 as described in reference to FIG. 2A. Fins 304 and isolation oxide 310 are formed on the substrate 302, for example as described in reference to FIG. 2A. The SRAM contains a plurality of SRAM cells 342; each SRAM cell 342 includes two driver finFETs 344, two load finFETs 346 and two passgate finFETs 348. The isolation oxide 310 is substantially uniformly thick in the SRAM cells 342, as described in reference to FIG. 2A through FIG. 2H. Reliable read and write operations in the SRAM cells 342 require the driver finFETs 344 to have on-state currents which are, for example, 25 percent to 100 percent higher than on-state currents in the passgate finFETs 348. The passgate finFETs 348 have fin heights which are less than fin heights of the driver finFETs 344, so that the passgate finFETs 348 have exposed fin heights which are at least 25 percent lower than exposed fin heights of the driver finFETs 344, which advantageously allows forming the driver finFETs 344 with a single fin 304 for each driver finFET 344. This provides a smaller SRAM area compared to an SRAM in which two fins are required for the driver finFETs to attain the necessary on-state current.

Referring to FIG. 3B, gates 312 are formed over the fins 304. The driver finFETs 344, load finFETs 346 and passgate finFETs 348 have one gate 312 each. The gates 312 may be polysilicon gates or may be metal replacement gates. The gates 312 may be formed with uniform width and uniform pitch distances, thereby advantageously providing a reduced area for the SRAM compared with variable gate widths and/or pitch distances to attain the necessary on-state currents in the driver finFETs and passgate finFETs.

Figure 4:
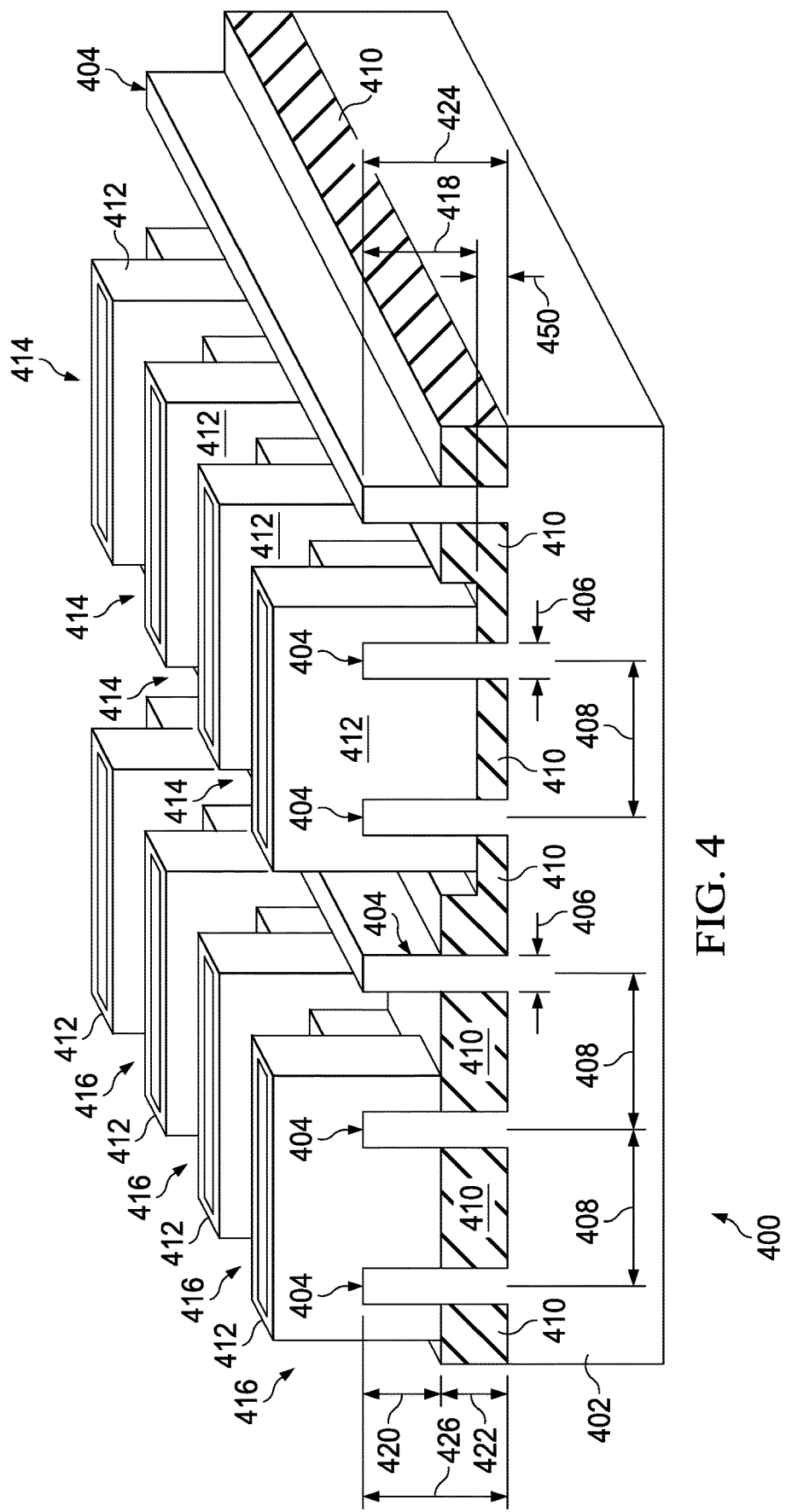
FIG. 4 is a cross section of another example integrated circuit containing finFETs.

FIG. 4 is a cross section of another example integrated circuit containing finFETs. The integrated circuit 400 is formed on a substrate 402 which includes semiconductor material such as silicon. Fins 404 are formed on the substrate 402, for example by forming an etch mask covering areas for the fins 404 and removing semiconductor material from the substrate 402 between the fins 404. Widths 406 of the fins 404 may be substantially equal. Pitch distances 408 between centers of adjacent fins 404 may be substantially equal. Fin heights 424 of the first finFETs 414 are substantially equal to fin heights 426 of the second finFETs 416.

Isolation oxide 410 is disposed over the substrate 402 adjacent to the fins 404. The isolation oxide 410 may possibly include silicon nitride or other dielectric material. The integrated circuit 400 includes at least one instance of a first finFET 414 and at least one instance of a second finFET 416. Instances of the first finFET 414 have a thickness 422 of the isolation oxide 410 which less than a thickness 450 of the isolation oxide 410 in instances of the second finFET 416, so that instances of the first finFET 414 have an exposed fin height 418 which is at least 25 percent more than an exposed fin height 420 of instances of the second finFET 416.

Gates 412 are disposed across the fins 404 and extend substantially down to the isolation oxide 410. The gates 412 may be metal replacement gates as depicted in FIG. 4 or may be polysilicon gates. Instances of the first finFET 414 and instances of the second finFET 416 may include one or more instances of the gates 412 over one or more instances of the fins 404.

Instances of the first finFET 414 have a higher on-state current than comparable instances of the second finFET 416 with equal numbers of gates 412 over equal numbers of fins 404. The thickness 450 of the isolation oxide 410 in the first finFETs 414 may be selected to provide a desired exposed fin height 418 and thus a desired on-state current. Forming the integrated circuit 400 with instances of the first finFET 414 and the second finFET 416 may advantageously provide desired circuit densities compared to an integrated circuit with substantially equal exposed fin heights in all finFETs.

Figure 5A:
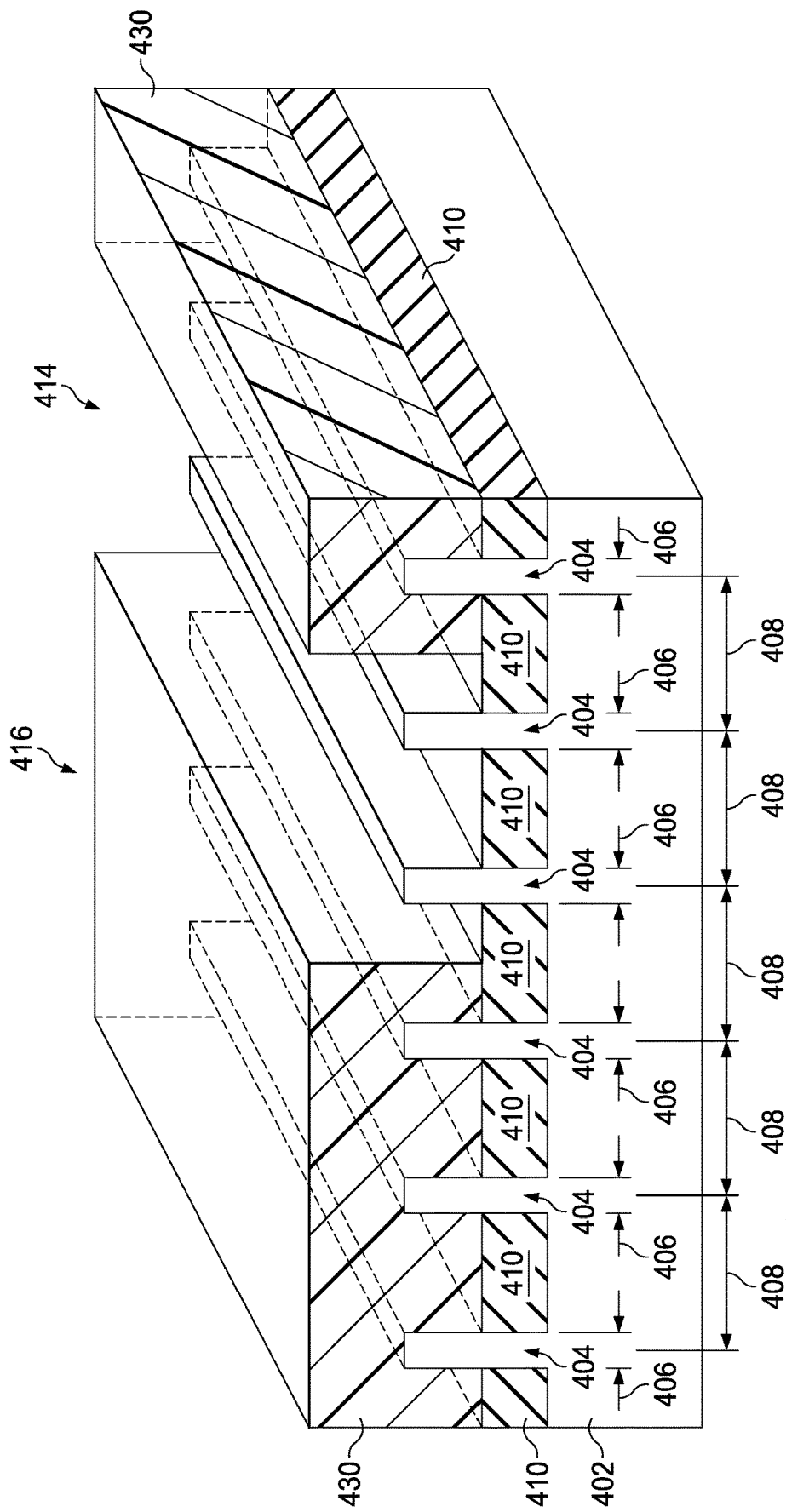
FIG. 5A through FIG. 5D are cross sections of the integrated circuit of FIG. 4, depicted in successive stages of fabrication.

FIG. 5A through FIG. 5D are cross sections of the integrated circuit of FIG. 4, depicted in successive stages of fabrication. Referring to FIG. 5A, the integrated circuit 400 is formed on the substrate 402, which may be a single crystal silicon wafer or an SOI wafer. The substrate 402 includes semiconductor material such as crystalline silicon or a silicon-containing compound semiconductor.

The fins 404 are formed in the semiconductor material of the substrate 402. The fins 404 may be formed, for example, by forming an etch mask over the substrate 402 which covers areas for the fins 404 and subsequently removing the semiconductor material exposed by the etch mask, leaving the fins 404. The etch mask is removed after the fins 404 are formed. Heights of the fins 404 are substantially equal. Widths 406 of the fins 404 may be substantially equal. Pitch distances 408 between centers of adjacent fins 404 may be substantially equal. Forming the fins 404 with substantially equal widths 406 and/or substantially equal pitch distances 408 may advantageously reduce a size and a fabrication cost of the integrated circuit 400.

The isolation oxide 410 is formed over the substrate 402 between the fins 404. The isolation oxide 410 may be formed as part of a field oxide formation process, such as an STI process. The isolation oxide 410 is substantially uniform in thickness at this stage of fabrication, so that exposed fin heights of the fins 404 at this stage of fabrication are substantially equal.

An etch mask 430 is formed over the fins 404 and the isolation oxide 410 so as to expose areas for instances of the first finFET 414 and cover areas for instances of the second finFET 416. The etch mask 430 may include photoresist formed by a photolithographic process, may include anti-reflection material, and/or may include hard mask material such as amorphous carbon.

Figure 5B:
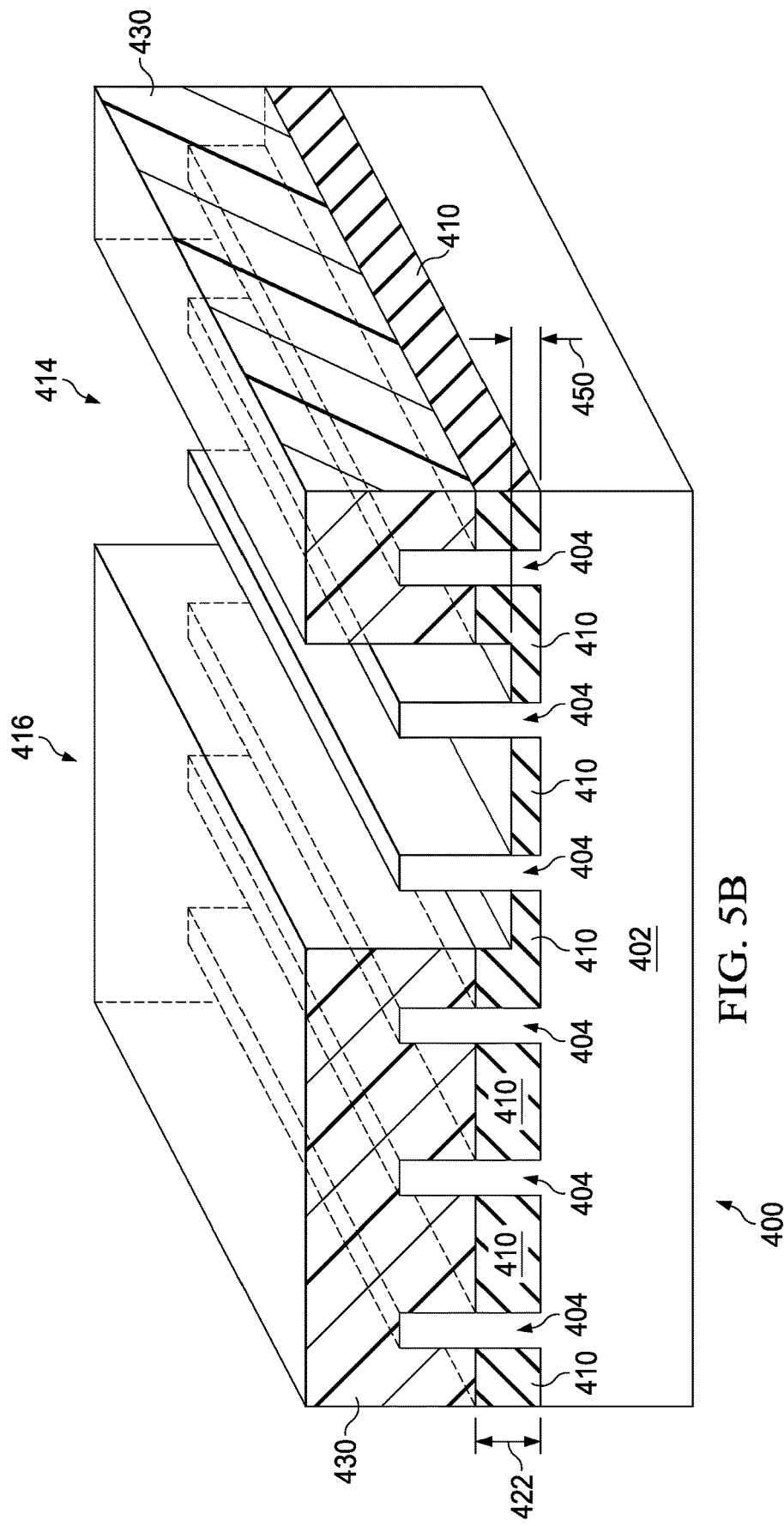

Referring to FIG. 5B, a portion of the isolation oxide 410 is removed in areas exposed by the etch mask 430. The isolation oxide 410 may be removed using an RIE process. The isolation oxide 410 is removed using an etch process which is selective to the semiconductor material in the fins 404, so that a thickness of semiconductor removed from the fins 404 is significantly less than the thickness of the isolation oxide 410 removed.

Figure 5C:
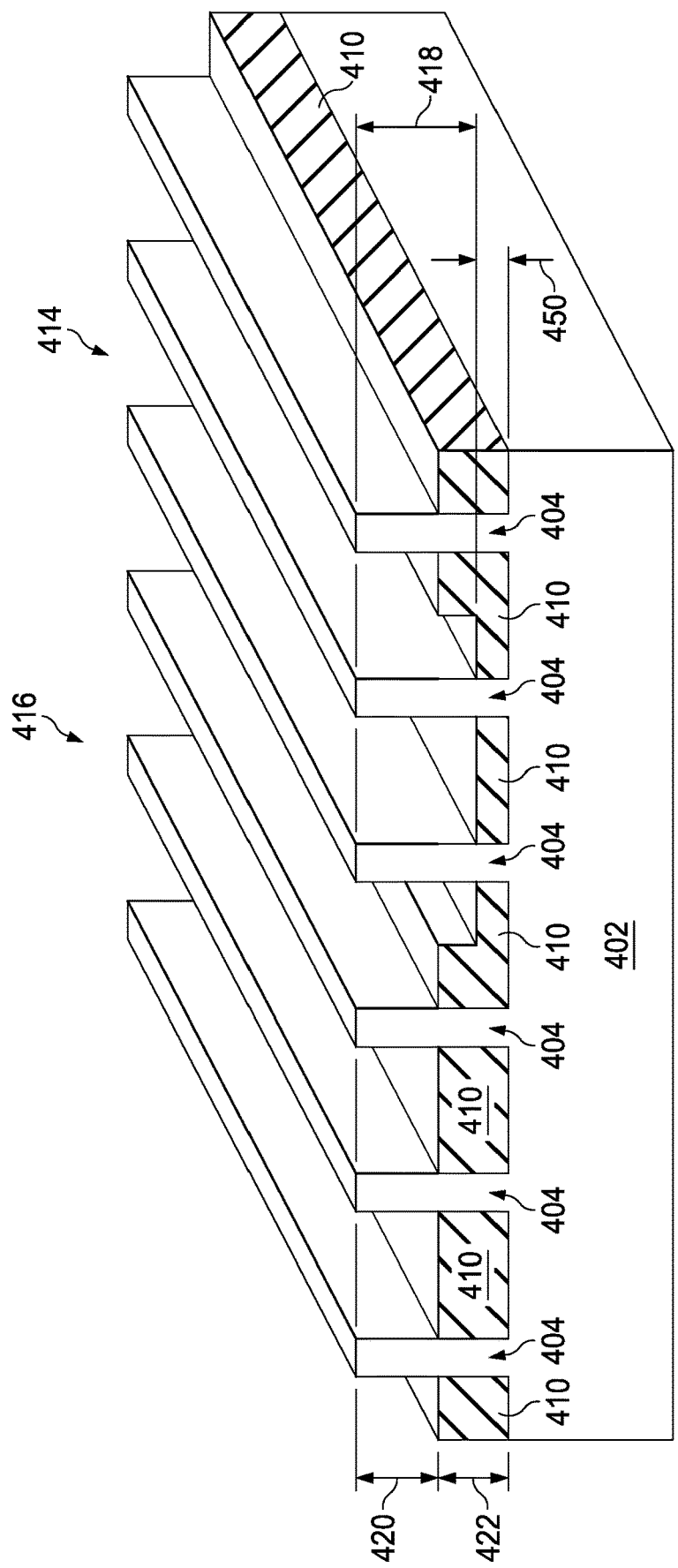

Referring to FIG. 5C, the etch mask 430 of FIG. 5B is removed, for example by an ashing process. After the etch mask 430 is removed, the exposed fin height 418 in the first finFET 414 and the exposed fin height 420 in the second finFET 416 are at desired values. Instances of the first finFET 414 have an exposed fin height 418 which is at least 25 percent more than an exposed fin height 420 of instances of the second finFET 416. Gate dielectric layers are formed on the fins 404, possibly by thermally oxidizing a layer of the semiconductor material in the fins 404.

Figure 5D:
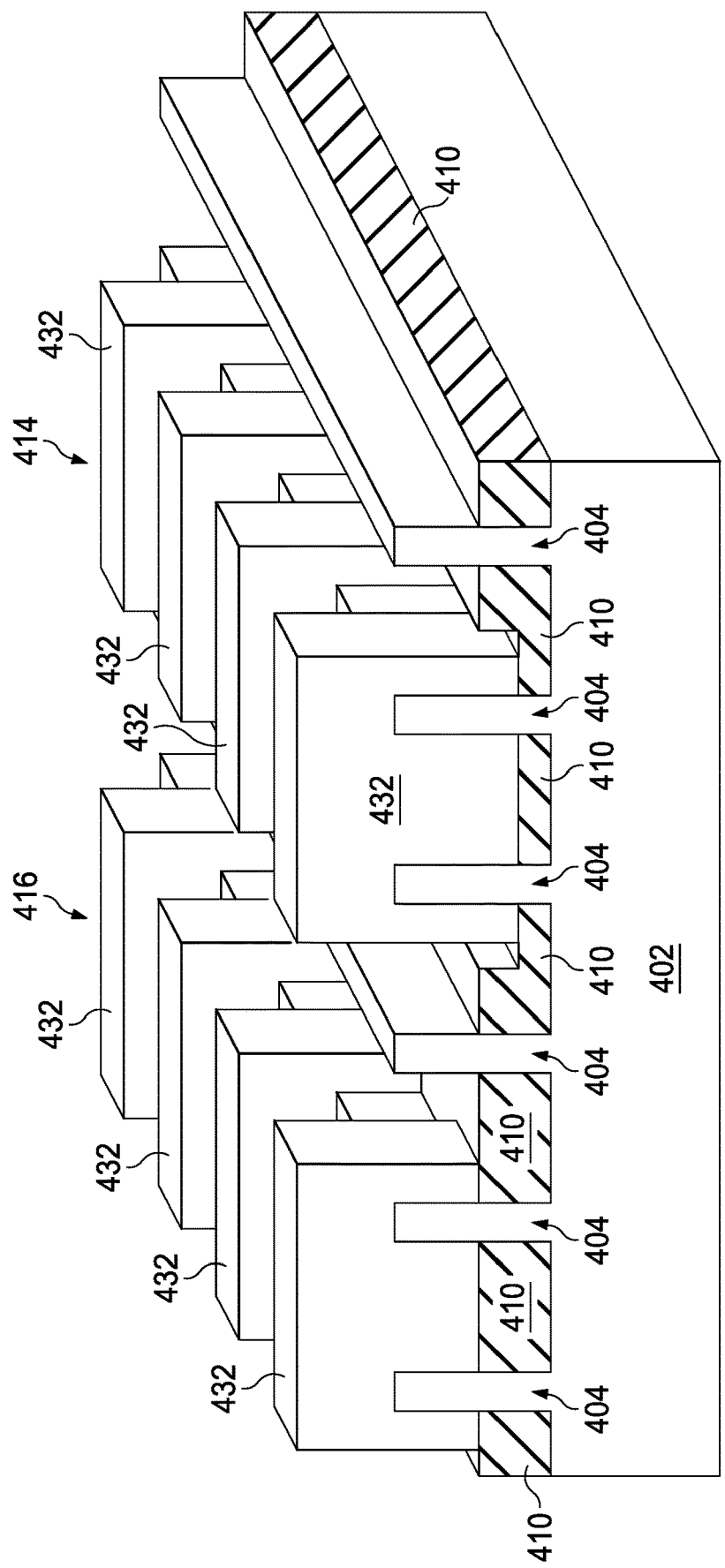

Referring to FIG. 5D, polysilicon gates 432 are formed over the fins 404 so as to extend substantially down to the isolation oxide 410. The polysilicon gates 432 may be formed to have uniform widths 434 and/or uniform pitch distances 436. Forming the polysilicon gates 432 with substantially equal widths 434 and/or substantially equal pitch distances 436 may advantageously reduce a size and a fabrication cost of the integrated circuit 400. The integrated circuit 400 may be completed with the polysilicon gates 432 in place, or metal replacement gates may be formed as described in reference to FIG. 2G and FIG. 2H, so as to form the structure of FIG. 4. Completing the integrated circuit 400 with the polysilicon gates 432 in place may advantageously provide a desired low fabrication cost. Forming metal replacement gates may advantageously provide a desired level of on-state current in the finFETs 414 and 416.

Figure 6A:
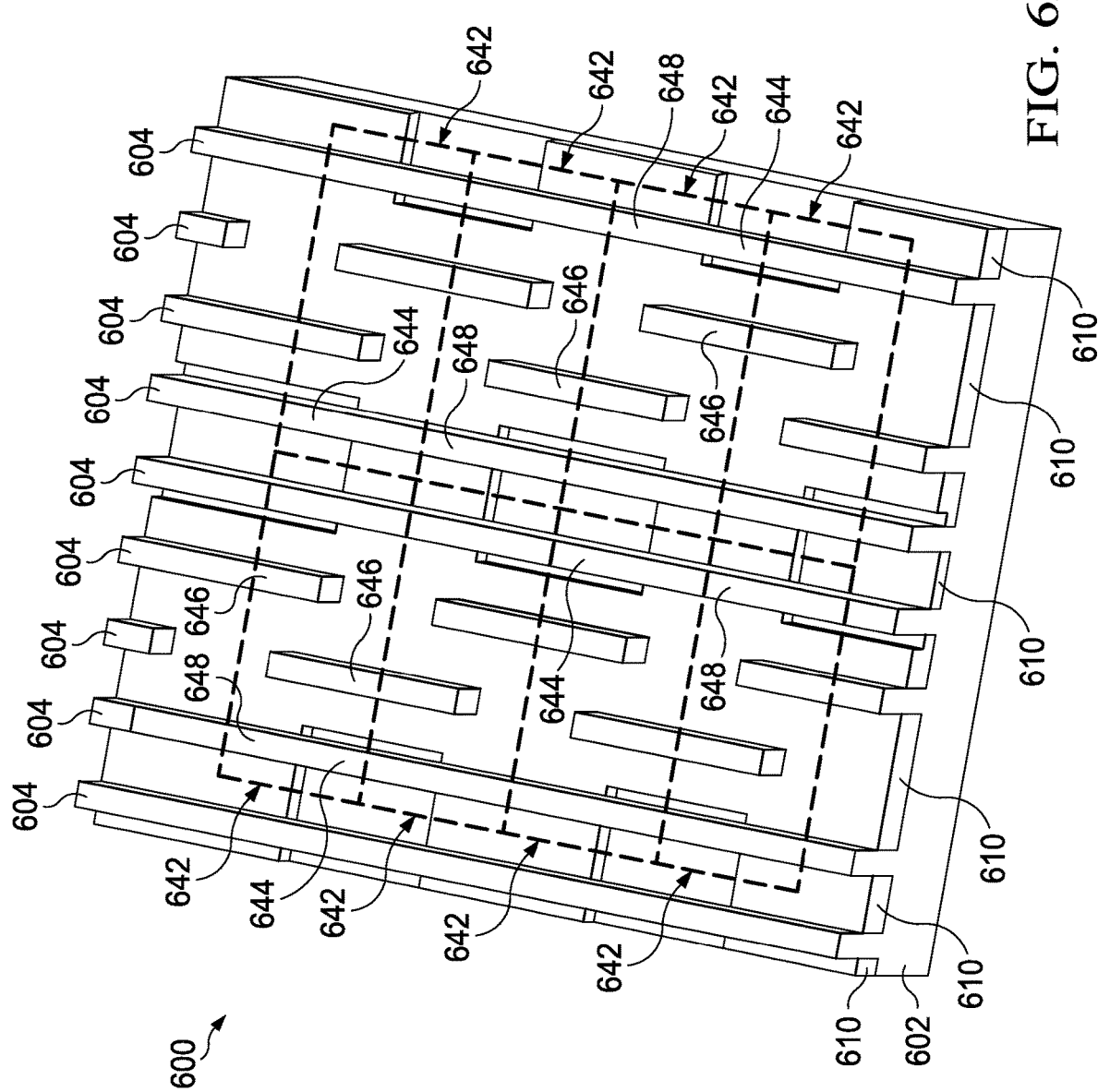
FIG. 6A and FIG. 6B are perspectives of an example integrated circuit containing an SRAM with finFETs formed according to the process of FIG. 4 and FIG. 5A through FIG. 5D.
Figure 6B:
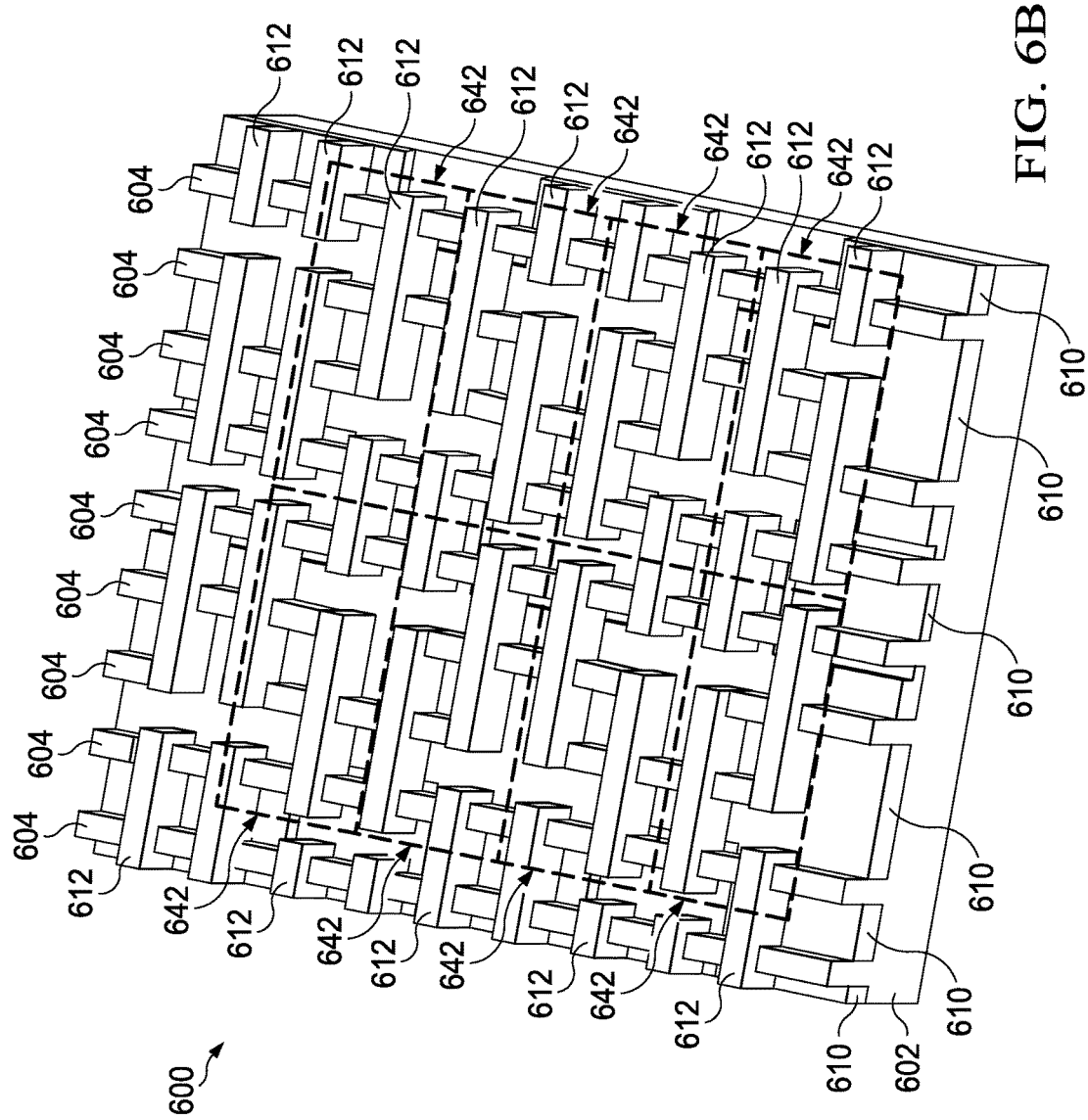

FIG. 6A and FIG. 6B are perspectives of an example integrated circuit containing an SRAM with finFETs formed according the process of FIG. 4 and FIG. 5A through FIG. 5D. Referring to FIG. 6A, the integrated circuit 600 is formed on a substrate 602 as described in reference to FIG. 2A. Fins 604 and isolation oxide 610 are formed on the substrate 602, for example as described in reference to FIG. 5A. The SRAM contains a plurality of SRAM cells 642; each SRAM cell 642 includes two driver finFETs 644, two load finFETs 646 and two passgate finFETs 648. Fin heights of the driver finFETs 644, load finFETs 646 and passgate finFETs 648 are substantially equal, as described in reference to FIG. 5A through FIG. 5D. Reliable read and write operations in the SRAM cells 642 require the driver finFETs 644 to have on-state currents which are, for example, 25 percent to 100 percent higher than on-state currents in the passgate finFETs 648. The isolation oxide 610 is thinner in the driver finFETs 644 than in the passgate finFETs 648 so that the passgate finFETs 648 have exposed fin heights which are at least 25 percent lower than exposed fin heights of the driver finFETs 644, which advantageously allows forming the driver finFETs 644 with a single fin 604 for each driver finFET 644. This provides a smaller SRAM area compared to an SRAM in which two fins are required for the driver finFETs to attain the necessary on-state current.

Referring to FIG. 6B, gates 612 are formed over the fins 604. The driver finFETs 644, load finFETs 646 and passgate finFETs 648 have one gate 612 each. The gates 612 may be polysilicon gates or may be metal replacement gates. The gates 612 may be formed with uniform width and uniform pitch distances, thereby advantageously providing a reduced area for the SRAM compared with variable gate widths and/or pitch distances to attain the necessary on-state currents in the driver finFETs and passgate finFETs.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
   providing a substrate comprising a semiconductor material;
   forming a first fin of semiconductor material of a first finFET and a second fin of semiconductor material of a second finFET on the substrate, so that a fin height of the first fin is substantially equal to a fin height of the second fin;
   forming isolation oxide over the substrate adjacent to the first fin and the second fin, so that the first fin and the second fin extend above the isolation oxide;
   forming an etch mask over the first fin, the second fin and the isolation oxide which exposes the isolation oxide adjacent to the first fin and covers the isolation oxide adjacent to the second fin;
   removing a portion of the isolation oxide from areas exposed by the etch mask, so that an exposed fin height of the semiconductor material of the first fin is at least 25 percent greater than an exposed fin height of the semiconductor material of the second fin; and
   forming a first gate of the first finFET over the first fin so as to extend down sidewalls of the first fin to the isolation oxide and forming a second gate of the second finFET over the second fin so as to extend down sidewalls of the second fin to the isolation oxide, wherein a single conductive structure comprises the first gate and the second gate.

2. The method of claim 1, wherein:
   the first finFET is a driver finFET in an SRAM cell; and
   the second finFET is a passgate finFET in the SRAM cell.

3. The method of claim 1, wherein the first fin and the second fin are formed with substantially equal widths.

4. The method of claim 1, wherein the first fin and fins adjacent to the first fin, and the second fin and fins adjacent to the second fin, are formed on substantially equal pitch distances.

5. The method of claim 1, wherein the first gate and the second gate are formed with substantially equal widths.

6. A method of forming an integrated circuit, comprising the steps of:
   providing a substrate comprising a semiconductor material;
   forming a first fin of semiconductor material of a first finFET and a second fin of semiconductor material of a second finFET on the substrate, so that a fin height of the first fin is substantially equal to a fin height of the second fin;

forming isolation oxide over the substrate adjacent to the first fin and the second fin, so that the first fin and the second fin extend above the isolation oxide;

removing a portion of the isolation oxide from areas adjacent the first fin and not areas adjacent the second fin, so that an exposed fin height above the isolation oxide of the semiconductor material of the first fin is greater than an exposed fin height above the isolation oxide of the semiconductor material of the second fin; and forming a first gate of the first finFET over the first fin so as to extend down sidewalls of the first fin to the isolation oxide and forming a second gate of the second finFET over the second fin so as to extend down sidewalls of the second fin to the isolation oxide, wherein a single conductive structure comprises the first gate and the second gate.

7. The method of claim 6, wherein:

the first finFET is a driver finFET in an SRAM cell; and the second finFET is a passgate finFET in the SRAM cell.

8. The method of claim 6, wherein the first fin and the second fin are formed with substantially equal widths.

9. The method of claim 6, wherein the first fin and fins adjacent to the first fin, and the second fin and fins adjacent to the second fin, are formed on substantially equal pitch distances.

10. The method of claim 6, wherein the first gate and second gate are formed with substantially equal widths.

11. The method of claim 6, wherein after forming the first gate and the second gate, the fin height of the first fin remains substantially equal to the fin height of the second fin.

12. A method of forming an integrated circuit, comprising the steps of:

performing an etch that etches a first area of a substrate to form a first fin of a first finFET and a second area of the substrate to form a second fin of a second finFET;

forming isolation oxide over the substrate adjacent to the first fin and the second fin, so that the first fin and the second fin extend above the isolation oxide;

removing a portion of the isolation oxide from areas adjacent the first fin and not areas adjacent the second fin, so that a first fin extension above the isolation oxide of the first fin is greater than a second fin extension above the isolation oxide of the second fin; and forming a conductive structure that extends from over the first fin to over the second fin, the conductive structure forming a first gate of the first finFET that extends down sidewalls of the first fin to the isolation oxide and forming a second gate of the second finFET that extends down sidewalls of the second fin to the isolation oxide.

13. The method of claim 12, wherein:

the first finFET is a driver finFET in an SRAM cell; and the second finFET is a passgate finFET in the SRAM cell.

14. The method of claim 12, wherein the first fin has a first width and the second fin has the first width.

15. The method of claim 12, wherein the first fin and fins adjacent to the first fin have a first pitch distance, and the second fin and fins adjacent to the second fin, have the first pitch distance.

* * * * *